United States Patent [19]

Taylor et al.

[11] 4,005,408
[45] Jan. 25, 1977

[54] MULTIPLE ELECTRON BEAM ANALOG TO DIGITAL CONVERTER

[75] Inventors: George W. Taylor, Brielle; Mortimer H. Zinn, Elberon, both of N.J.

[73] Assignee: The United States of America as represented by the Secretary of the Army, Washington, D.C.

[22] Filed: Oct. 8, 1975

[21] Appl. No.: 620,686

[52] U.S. Cl. .............................. 340/347 P; 315/3; 250/398; 315/374
[51] Int. Cl.² .................................. H03K 13/02
[58] Field of Search ............... 340/347 P, 347 AD; 315/3, 5, 5.14, 5.15, 5.16, 13 R, 365, 366, 369, 372–376; 250/396–398

[56] References Cited
UNITED STATES PATENTS

| | | | |
|---|---|---|---|
| 2,729,701 | 1/1956 | Levy | 340/347 P |
| 2,733,410 | 1/1956 | Goodall | 340/347 P |
| 3,015,814 | 1/1962 | Lippel | 340/347 P |
| 3,849,695 | 11/1974 | Piazza et al. | 315/3 |
| 3,878,532 | 4/1975 | Buck | 340/347 AD |

Primary Examiner—Thomas J. Sloyan
Attorney, Agent, or Firm—Nathan Edelberg; Sheldon Kanars; Daniel D. Sharp

[57] ABSTRACT

A typical embodiment of the invention is a multiple electron beam device for converting analog input signals into coded digital output signals. A beam of electrons, generated through a Watkins-Johnson laminar flow sheet beam electron gun is focused before being divided into eight individual beams by means of an eight section traveling wave time deflection system. The individual beams then are controlled by means of a traveling wave analog deflection system before they pass through an apertured target structure that corresponds to the digital code. The beams traveling through this target impact on a diode target array which then generates a coded digital output signal that corresponds to the analog input.

7 Claims, 5 Drawing Figures

MULTIPLE ELECTRON BEAM ANALOG TO DIGITAL CONVERTER

The invention described herein may be manufactured and used by or for the Government for governmental purposes without the payment of any royalties thereon or therefore.

BACKGROUND OF THE INVENTION

1. Field of the Invention

This invention relates to electron beam devices and, more specifically, to multiple electron beam devices for converting analog electrical input signals into coded electrical digital output signals, and the like.

2. Description of the Prior Art

For a number of reasons it is preferable to manipulate electrical signals that are in coded digital form, rather than to process analog signals, in which the amplitudes of the analog signal voltages generally correspond to the respective values of the related digital sequences. Thus, a system of two electrical voltages, in which one voltage is ascribed a value of "zero" and the other voltage is accorded a value of "one", can be used with great efficiency to express numerical values in computers and in other automatic data processing equipment. Numerical values translated into this one-zero system usually are referred to as binary numbers in contrast to the "base ten" system that ordinarily is employed outside of the field of automatic computation. As might be expected, several binary coding systems, including a system known as "the Gray code," have been developed to express base ten numbers in the form of digital sequences of ones and zeroes.

There is then the difficult technical problem of swiftly and accurately converting signals, in which voltage amplitudes are related to respective numerical values or to magnitudes of some physical observation, into individual sequences of digital pulses that embody, in the particular code, the numerical value of the electrical analog input.

For many years, a considerable effort has been expended to apply cathode-ray tube principles to this task of analog to digital signal conversion. For example, as described in more complete detail in the article titled "Logical Detenting in Cathode-Ray Coding Tubes" by Bernard Lippel, Institute of Radio Engineers Transactions on Instrumentation, March, 1958, I-7, pages 29 through 37, a cathode-ray coding tube has a glass envelope to preserve a vacuum for a flat sheet of electons that are emitted from a "gun" within the envelope. The analog voltage is applied to this electron beam through a pair of deflection plates that are spaced from each other on opposite sides of the beam. The electrical field established by the analog voltages on the deflection plates cause the sheet of electrons from the gun to sweep through angles that are generally proportional to the magnitudes-or amplitudes-of the applied input signals. An apertured mask is spaced from the gun and the deflection plates in order to selectively obstruct the electron beam that is sweeping in response to the analog signals.

The apertures or perforations in the mask form a pattern that corresponds, for example, to the Gray code. In this respect, for any given angular electron beam displacement relative to the deflection plates, the particular array of perforations and electron-blocking solid portions of the mask is the digital equivalent, in the Gray code, of the amplitude of the analog voltage on the deflection plates that produced the specific angular displacement of the sheet of electrons in question. The electrons that pass through the mask apertures impact on an output signal collector, and it is this collector signal that is the desired Gray code digital output. A number of output signal collectors have been proposed for this application of which photo-electric cells that respond to light emitted from phosphors deposited on the face of the cathode-ray tube, wire grids, and the like are typical.

In contrast to the signal processing speeds that characterize present-day signal processing techniques, however, these cathode-ray tube analog to digital signal converters do not have sufficiently fast responses to justify their use. Some of these proposals, moreover, require voltages to accelerate the electrons in the beam that can be as high as 10,000 volts.

There is, moreover, a further important consideration that bears on this problem of speed in signal conversion. For a number of reasons, signals of the type generated by analog to digital conversion circuits are not steadily or continuously applied to the balance of the signal processing circuits. These digital signals are, instead, periodically "sampled" at extremely high frequencies. Typically, these signals might be sampled as many as one hundred million to four hundred million times per second. Consequently, for a sampling rate of 100 million cycles per second an interval of only 12.5 picoseconds is available to sample all of the digits in an eight digit code if an error not greater than plus or minus one digit is permissible. In the circumstances, an acceptable electron beam analog to digital signal converter must generate the necessary output signal at the proper voltage level many times in each second, and in each instance the time in which this signal can be generated is very short.

Consequently, there is a need for a high speed electron beam analog to digital converter that produces accurate signal conversion with speeds that are significantly greater than those which have been heretofore attainable.

Accordingly, it is an object of the present invention to increase signal conversion speed to an extent that justifies the use of an electron beam analog to digital signal converter.

SUMMARY OF THE INVENTION

These and other problems that have beset the prior art are overcome, to a large extent, through the present invention. For example, to satisfy these demanding time requirements the analog deflection of the electron sheet beam is reduced to a minimum deflection angle through one of the structural features of the invention. The total number of diodes which must be scanned by the electron beams that impact the diode target array also is minimized and the diode rows in the target array all are scanned simultaneously, all to the end of reducing the signal conversion time.

In accordance with these principles, an electron beam analog to digital converter device that typifies the invention has a cathode which emits electrons in a sheet beam, i.e., a flat beam of electrons that has an appreciable width moving from the cathode to the anode in contrast to the usual cathode-ray tube electron beam that is, essentially, a thin line of electrons flowing from cathode to anode. Focus electrodes are provided for the sheet beam in order to sharpen the beam for passage through a traveling wave time deflection system. This time deflection system is an important feature of the invention inasmuch as it splits the sheet beam into a number of individual beams, each of which is separately deflected within the traveling wave time deflection system to impact appropriate portions of the diode target array at a predetermined signal sampling rate and with sufficient intensity to produce an output of signals that have useful levels.

A traveling wave analog deflection system is spaced between the time deflection system and the target structure in order to deflect the individual electron beams that are emitted from the time deflection system through angles that are generally related to the amplitude of the input analog signal. In accordance with a further principle of the invention, to reduce the deflection angle that is required to scan the electron beams across the target structure and the diode target array, and thereby to significantly decrease the analog to digital signal conversion time, the pattern of perforations in the mask and the associated electron beam semiconductor diodes that correspond to the illustrative Gray code may be divided into at least two small, side-by-side matrices. The first of these matrices that form the code pattern consists of several columns, each comprising a number of diodes. These columns correspond to the lowest order digits. The next matrix of columns and diodes correspond to the next higher order of digital columns in the Gray code. Thus, the traveling wave analog deflection system that deflects electron beams for a Gray code two-matrix target system necessarily must have two analog deflection systems, each system to deflect electron beams for the respective target matrix, although a single target array could be used if desired. In this latter situation, only one analog deflection system would be required.

To reduce the number of diodes required in the target and to keep the deflection voltages as well as the beam current density to reasonable values, a further device for switching bias voltages in series with the lower order digit analog deflection system is provided. This device is structurally similar in many ways to the above-described multiple beam device. This device, however, will not require a time deflection system and will only need a single analog deflector.

Thus, there is provided in accordance with the invention a multiple beam simultaneous deflection system for an electron beam analog to digital signal converter in which the bias switching problem is largely solved and in which the signal conversion time is substantially reduced because of an unusual target and analog deflection structure. It should be noted in this respect, moreover, that a screen lens can be provided to produce a barrier grid action and to reduce cathode loading requirements.

The exact nature of this invention as well as other objects and advantages thereof will be readily apparent from consideration of the following specification relating to the annexed drawing.

DETAILED DESCRIPTION

Figures 1, 2, 5:
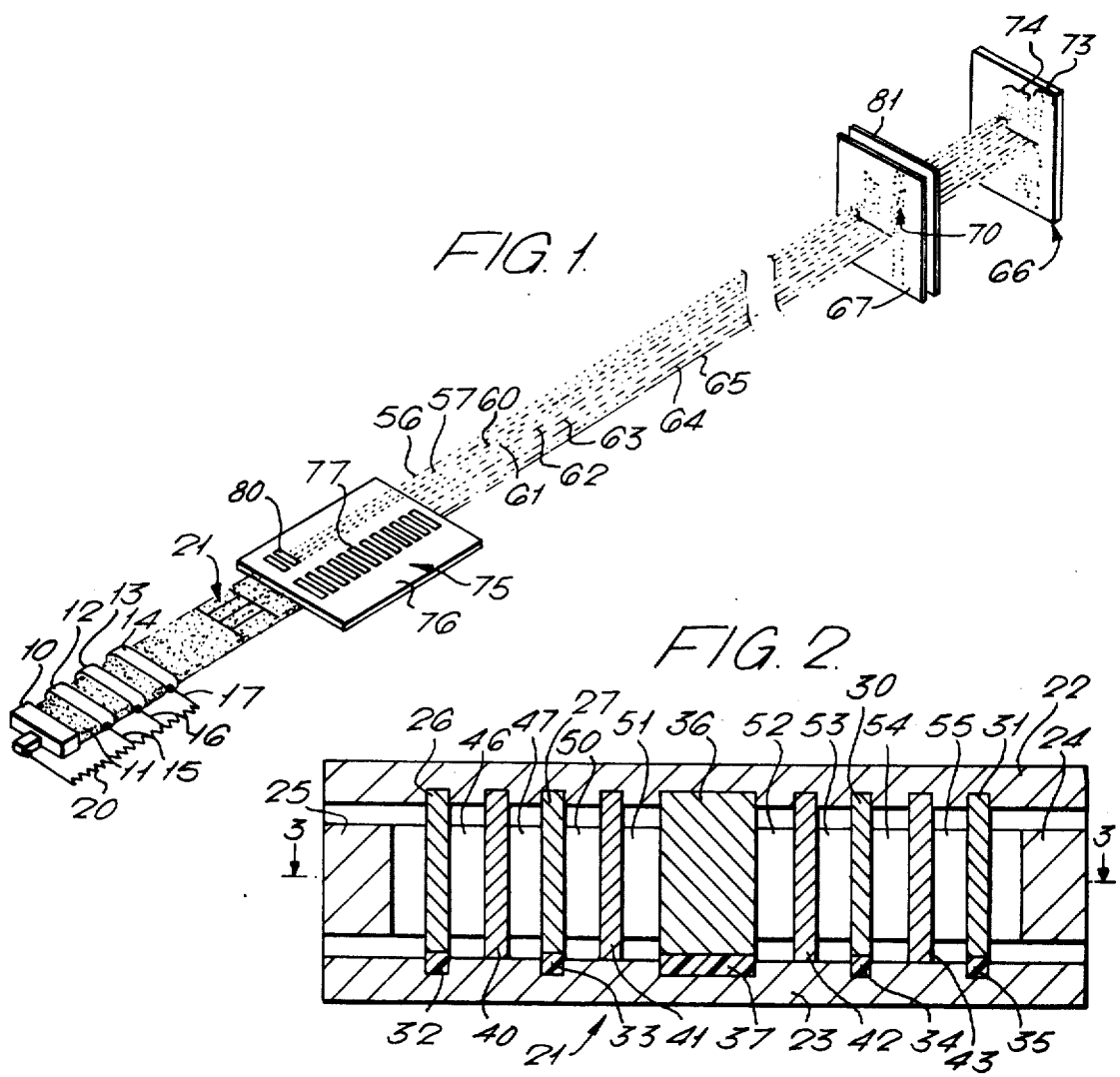
FIG. 1 is a schematic perspective view, not drawn to scale, of a multiple electron beam analog to digital signal converter that embodies principles of the invention.
FIG. 2 is a front elevation, in full section, of a typical time deflection system for use in the device that is shown in FIG. 1.
FIG. 5 is a schematic diagram of a switching circuit for use with the system that is shown in FIG. 1.
Figure 3:
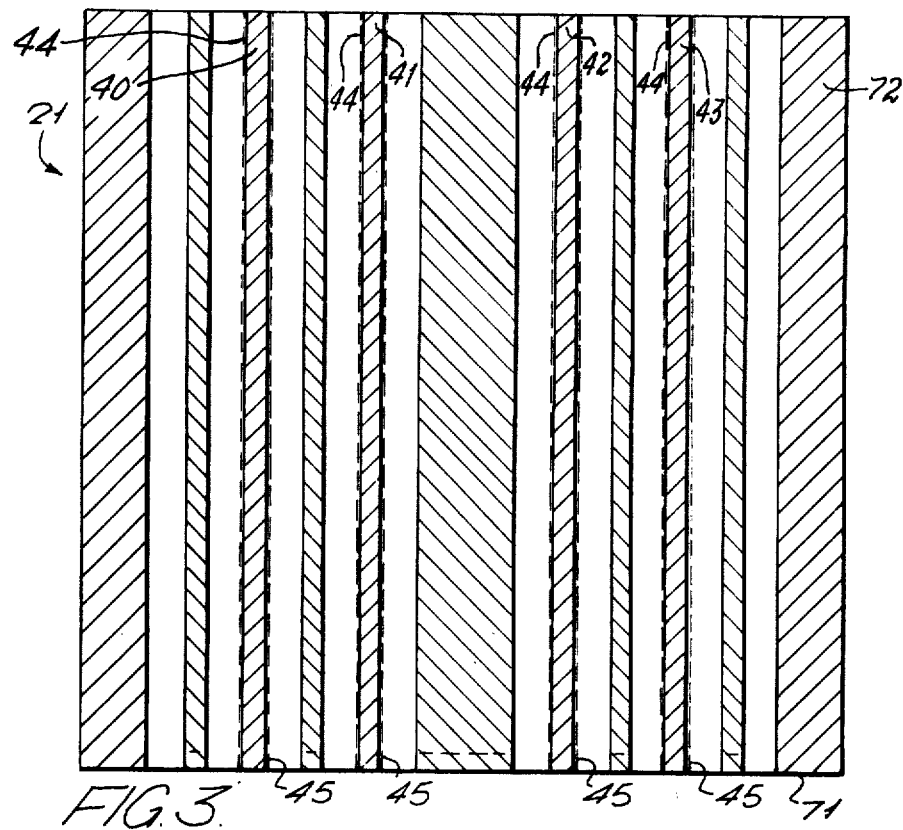
FIG. 3 is a plan view in full section of the time deflection system that is shown in FIG. 2, viewed in the direction of the arrows 3—3 of FIG. 2.

For a more complete appreciation of the invention attention is invited to the accompanying drawing, in which FIG. 1 shows an illustrative multiple electron beam analog to digital signal converter wherein calculations are presented for a single specific application. It should be clear that other dimensions could be used to meet other specific digital requirements. Thus, a cathode 10, and focusing electrodes 12, 13 and 14 are positioned to generate a sheet beam of electrons 11 in an envelope (not shown) that establishes a suitable vacuum for the signal converter. In this respect, a Watkins-Johnson laminar flow sheet beam gun should be suitable for the purposes of the invention. The proper voltage relation between the focusing electrodes relative to each other and to the cathode 10 is established through taps 15, 16 and 17 on a potentiometer 20. In accordance with a characteristic of the invention, an illustrative eight section traveling wave time deflection system 21 is spaced from the last focusing electrode 14 in alignment with the electron sheet beam 11. Specific physical features of the illustrative time deflection system are shown in FIGS. 2 and 3. FIG. 2, for example shows a flat, horizontally disposed metallized ground plane connecting plate 22 of alumina or the like spaced above a flat metallized "meanderline" plate 23 by means of a pair of vertical, transversely spaced dielectric holders 24, 25. Four vertically disposed copper plates 26, 27, 30 and 31 that are each 25 mils wide and 5 mils thick are coupled in parallel electric contact with the ground plane connecting plate and terminate, at their lower ends on respective electrical insulating blocks 32, 33, 34 and 35 that are nested in individual grooves formed in the upper surface of the meanderline plate 23. A vertical, centrally disposed copper plate 36 that is 25 mils thick also is in parallel electrical contact with the ground plane connecting plate 22 and is electrically insulated from the meanderline plate 23 by means of an insulating block 37 that is interposed between a notch in the top surface of the meanderline plate 23 and the bottom of the 25 mil copper plate 36. All of these copper plates are 207 mils long and act as ground planes in the traveling wave deflection system 21.

Alumina plates 40, 41, 42 and 43 each 25 mils wide, 5 mils thick and 207 mils long are vertically interposed between and equidistantly spaced from adjacent pairs of the copper plates 26, 27, 30, 31 and 36. As shown best in FIG. 3, all of the alumina plates 40, 41, 42 and 43, moreover, have "meanderlines" 44, 45 printed on opposite vertical surfaces. It should be noted at this point that the term "meanderline" identifies a type of traveling-wave or distributed-element electron beam deflection structure that often is used in high-frequency cathode-ray tube and deflected-beam electron bombarded semiconductor devices. A more detailed description and analysis of meanderline deflection structures can be found, for example in the letter titled "The Deflection Sensitivity of Traveling-Wave Electron- Beam Deflection Structures" by A. Silzars and R. Knight, IEEE Transactions On Electron Devices, November, 1972, pages 1222 to 1224. Suffice to state that the meanderlines 44, 45 printed on the vertical sides of the alumina plates 40, 41, 42 and 43 are in electrical contact with the meanderline plate 23. The meanderline dimensions required to provide a velocity in vacuum to match that of a 2,500 volt electron beam, moreover, has 10 mil legs which are 0.52 mils wide and have a 0.52 mil separation between each leg. The meanderlines on both sides of all of the alumina plates 40, 41, 42 and 43 are electrically connected in parallel to input end 71 and output end 72 of the time deflection system 21.

In the illustrative time deflection system 21 that is shown and described herein, the combinations of alumina plates 40, 41, 42, 43 with the associated meanderlines 44, 45 and the adjacently interleaved copper plates 26, 27, 30, 31 and 36 define eight 10 mil by 10 mil apertures 46, 47, 50, 51, 52, 53, 54 and 55 through which eight respective electron beams pass. The aperture size of 10 mils by 10 mils was used in an embodiment of the invention. It should be noted, however, that the apertures need not be of square configuration, as is indicated in FIG. 2. Thus, the time deflection system 21 serves to split the sheet beam of electrons 11 (FIG. 1) into eight separate electron beams 56, 57, 60, 61, 62, 63, 64 and 65 and to increase the permissible dwell time of each of these separate beams on individual electron beam semiconductor diodes in a diode target array 66 in order to generate maximum output signals from the diodes in the array within the error requirements established for the application.

For the purpose of the time deflection system 21 that is described, a number of design assumptions have been made. In this regard, a 5 mil electron beam in each of the apertures 46, 47, 50, 51, 52, 53, 54 and 55 at its steady state position is deflected by a constant bias that results in a complete cut off of the electron beams at a target aperture plate 67. It is further assumed for the basis of this specific design that after the center of each of the individual electron beams has been deflected 10 mils, each beam current is completely cut-off and collected at the target plate 67. To prevent the beam from one set of deflection plates from entering apertures 70 for the wrong column in the target aperture plate 67, moreover, a combination of beam interception plates and voltage clipping of the time deflection signal can be used.

Using the stripline approximation for the meanderline 44, the impedance of a single meanderline-ground plane system is calculated as approximately 280 ohms. Because eight of these individual systems are connected in parallel, however, the resulting impedance is 35 ohms. Assuming that a 50 megahertz (MHz) sine wave signal is used to generate a 100 MHz sampling rate by sweeping across the diode columns in the diode target array 66 on both the positive going and negative going portions of the cycle, a 50 MHz signal with a root mean square (RMS) voltage of 40.5 volts (alternating current) is required as the voltage to be achieved across the load in the absence of clipping. The total power required to drive the time deflection system 21 without clipping a 50 MHz signal is calculated to be 49.6 watts.

At higher frequencies, however, the power requirements are reduced because the 0.225 volt deflection signal that is needed to deflect each of the eight electron beams through a 10 mil distance is reached in a greater number of radians for the same time duration at these higher frequencies. A tabulation of power requirements for the unclipped pulse at different frequencies of interest is as follows:

| Drive Frequency (MHz) | Sampling Rate (MHz) | RMS Voltage (Volts) | Power (Watts) |
|---|---|---|---|
| 50 | 100 | 40.5 | 46.9 |
| 100 | 200 | 20.3 | 11.8 |
| 200 | 400 | 10.1 | 2.9 |

If it is necessary to clip the voltage, there are a number of additional problems that must be considered. For instance, signal reflections caused by impedance mismatches, rectification of the backswing voltage, and the like, in the time deflection system 21 must be overcome or compensated. Proper choice of the length of the signal transmission line can avoid having reflections occur during the clip period. If it further appears that reflections are of sufficient magnitude to cause false output signals during the rectified back half-cycle of the sampling signal, then the cathode 10 (FIG. 1) can be blanked, or essentially turned off during this period.

It will be recalled that the diode target array 66 preferably is divided into at least two matrices 73, 74 in order to reduce the angle through which the eight separate electron beams must be swept, and thereby to reduce the time required for conversion from analog to digital signals. Traveling wave analog deflection system 75 (FIG. 1) must be able to deflect two groups of the separate electron beams through different angles at essentially the same time. Thus, in accordance with another feature of the invention, the analog deflection system 75, spaced about 250 mils from the time deflection system 21 and in alignment with the eight separate electron beams as subsequently described, is provided with a flat, horizontally disposed ground plate 76 that underlays all eight separate electron beams. An analog meanderline 77 over the ground plate 76 is provided for the separate electron beams 62, 63, 64 and 65 which are allocated to the diode matrix 73, the lowest order of digits in the Gray code. The analog meanderline 77 makes it necessary only to keep the transit time through any one leg of the meanderline short with respect to the signal sampling interval, or "aperture" time. In this respect, a tape width small enough to have a transit time of 5 picoseconds at 2,500 volts is on the order of 0.006 inches. Thus, if a 0.005 inch tape with approximately 0.060 inch long legs and a spacing between the sections of 0.002 inches is used, the velocity of the signal on the meanderline 77 will match that of a 2,500 volt electron beam. In the specific embodiment of the invention under consideration, the traveling wave deflection system will have a negligible effect on the deflection during the signal sampling interval. Because the voltage deflecting the beams when they enter the analog deflection system 75 continues to act on each of the separate beams as they pass the deflection plates, it appears that to achieve a suitable spot deflection, the ratio of deflection voltage to plate separation should be 127 volts/inch, assuming a distance of 10 inches from the center of the deflection system to the target and a 1.5 inch deflection system length. Using a stripline impedance relation as an approximation for the delay line, with a spacing equal to 0.100 inches, the impedance is computed to be 285 ohms, although a somewhat smaller impedance may be realized in practice.

Further with respect to the analog meanderline 77, to minimize electrical reflections caused by connectors, it would be preferable to terminate the line internally. Thus it further appears that the required total deflection voltage is 12.7 volts measured peak-to-peak, or 4.49 volts (alternating current) to produce a total drive power of 70 milliwatts.

As shown in FIG. 1 of the drawing, a second analog meanderline 80 is provided in the analog deflection system 75 to regulate the sweep of the separate electron beams 56, 57, 60 and 61 across the diode matrix 74 in the target array 66. It will be recalled that the matrix 74 corresponds to the higher order of digits in the illustrative Gray code. Consequently, the deflection that is to be applied to the separate electron beams 56, 57, 60 and 61 should be different from that which is applied to the separate electron beams 62, 63, 64 and 65 that register the lower order of digits in the Gray coded diode matrix 73. In any event the deflection for this second diode array is 190 mils. The ratio of deflection sensitivity of the second analog meanderline system 80 to that of the first analog meanderline system 77, moreover, should be such that the electron beams are deflected 12.5 mils by the second system when the first system deflects its respective beams 200 mils. The relative deflection ratio in this instance, is 1/16. Another physical characteristic of the second analog meanderline system 80, for the illustrative device being described, is a deflection system length of 0.0467 inch. In these circumstances, the second deflection system is approximately 3.33 cycles of meanderline. It also requires approximately 70 milliwatts of drive power.

The target aperture plate 67, which is a part of the overall target structure, has a number of functions. Primarily, the target structure isolates the semiconductor targets in the diode target array 66 from the rest of the device. This specific feature of the target structure permits the accelerating voltage of the main portion of the device to be limited to 2,500 volts instead of the 10,000 volts that is necessary for the electron beam semiconductor portion of the device that have been required for electron beam semiconductor operation in other applications. The lower accelerating voltage thus provided simplifies the deflection system requirements.

Figure 4:
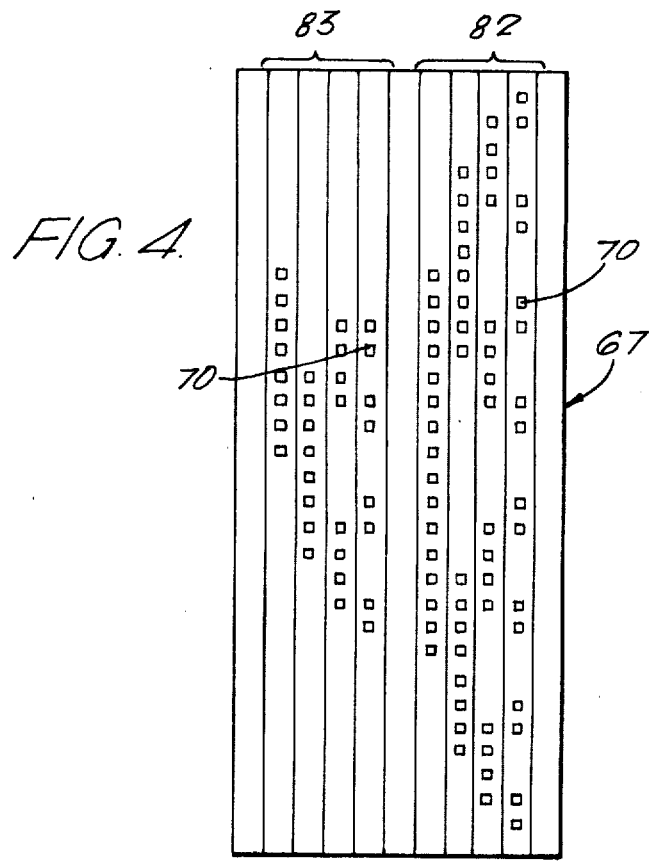
FIG. 4 is a front elevation of a target aperture plate for use in connection with the device shown in FIG. 1.

The target structure also is designed to limit the separate electron beams from entering incorrect apertures by collecting overdriven electron beams on fins that are provided for the purpose. Two plates, the target aperture plate 67 and another aperture plate 81 that is in alignment with the plate 67 and interposed between the plate 67 and the diode target array 66 operate as a "screen lens" which demagnifies the aperture openings of 5 mils by 5 mils in order to form images at the plane of the diode target array that are 2.5 mils by 2.5 mils. This particular feature of the invention permits the cathode to be designed for a moderate loading of, perhaps, 250 milliamperes/$cm^2$ and nevertheless enable the electron density of the separate beams to achieve about 1 ampere/$cm^2$ at the target diode. A typical target aperture plate 67 is shown in more complete detail in FIG. 4. The apertures 70, which in the example at hand are each 5 mils by 5 mils, are arranged in the lower order Gray code matrix group of four columns 82 and a group of four columns 83 of apertures that relate to the higher order of Gray code digits.

The spacing between the aperture plates 67, 81 that comprise the target structure and the diode target array 66 is determined from the ratio of the voltages on the two sides of the apertures and the required amount of demagnification.

An arrangement of electron beam semiconductor diodes, each semiconductor diode being 2.5 mils by 2.5 mils in the plane that is perpendicular to the direction of the separate electron beams are positioned on a plate in an array that matches the apertures 70 (FIG. 4) in the target aperture plate 67. With the use of these small diodes, the problem of overlap of rows can be minimized, depending on the actual shapes of the separate beams and the electron distributions that are achieved. Each of the diodes in every respective column is connected in parallel with the other diodes in the same column in order to form a single output signal for each digit. In the example under consideration, each digital line in the first matrix 73 would contain sixteen diodes of equal area spaced appropriately as determined by the target aperture plate 67. This results in a total capacitance for each column of 0.52 picofarads. If it is assumed that an electron beam current density at a particular diode is 1 ampere/$cm^2$, a diode gain of 1,032 and an average electron beam dwell time of 10 picoseconds, the change in voltage appearing at the signal output should be about 800 millivolts. This signal could be capacitively coupled to the follow on logic circuits (not shown). It should be noted that diode coupling also could be used. Further, it is not absolutely necessary to divide the Gray coded target diodes and plate apertures into two matrices as shown and described herein. One single matrix could be used for the entire Gray code, if desired. In this circumstance, only one analog meanderline would be used with the analog deflection system 75.

In order to minimize the number of diodes needed in the system, as well as to keep the deflection voltages and, where necessary, the current density to acceptably low values, a system for switching bias in series with the low order digit analog deflection system 77 is provided. To fill this need a second electron beam semiconductor device is provided to switch the biases.

The design of this switching device preferably is somewhat similar to the analog to digital converter that is shown and described in FIG. 1. The physical parameters, of the cathode, for example, are different in that only a ray beam would be required. A time deflection system is not required in the switching device. The analog deflection system should be identical to that which is used for the higher order digit deflection system 80 (FIG. 1).

In FIG. 5 a schematic diagram of the switching circuits is shown. An array of electron beam semiconductor diodes 84, is used as the target-end of the bias switching device which is swept by the ray beam which, in turn, has been deflected by deflection plates equivalent to the higher order analog deflection system 80 (FIG. 1). The collections of the electron beam semiconductors 84 are individually connected to one side of the low order deflection system 77 (FIGS. 1 and 5) of the analog deflection tube in series with fixed batteries which are multiples of the full sweep voltage, E, as shown in FIG. 5. The emitters of the semiconductors 84 are coupled to the emitters of respective isolation diodes 85. The collector ends of the isolation diodes are connected together and are then coupled to the other plate of the analog to digital converter low order deflection system 77. A resistor, 86, as shown, may also be connected in parallel with the deflection plates. The analog signal voltage source 88 that is capacitively coupled to the analog to digital converter tube is also shown in FIG. 5. This signal is delayed compared to that applied to the switching device. This time delay is chosen to permit the time of appearance of the signal at the input end of the analog deflection system 75 (FIG. 1) to be greater than the appearance of that identical signal value at the input end of the switching device analog deflection plates and equal to the time of flight of the electrons in the switching device from the front of the deflection plate to the target and the transit time of the carriers in the electron beam semiconductor target. In this circumstance, most of the time the bias voltage will have been selected before a sampling interval or "aperture" time period occurs, although it might be possible that the need to change the bias occurs immediately before or during the sampling interval. Because the deflection plates that are being shifted in bias are transmission lines, only the stray capacitance in front of the line needs to be charged from the electron beam semiconductor constant current source. Illustratively, a change of 12.8 volts in 1 picosecond across 0.5 picofarads requires a constant current of 6.4 amperes. Currents of this order can be obtained from diodes that have active areas of 12 mils by 30 mils. Diodes of this size should therefore enable the use of the switching system without compromising the analog to digital conversion accuracy requirements.

Clearly, many modifications and variations of the present invention are possible in the light of the above teachings and the invention may be practiced otherwise than as specifically described.

More than one analog to digital conversion system can be serviced from a common switching device. In this respect, it might be necessary to duplicate the target arrays in the switching device.

Although in the illustrative embodiment of the analog to digital signal converter that is described herein, a two matrix electron beam semiconductor diode target array is shown and described, a single matrix system could be used for the Gray code, but at a significant penalty in deflection voltage and signal amplification. There may, however, be applications where this is permissible in conjunction with the saving of the use of the bias switching device that is described above.

What is claimed is:

1. An electron beam analog signal to digitally coded electrical signal conversion device, comprising; a cathode for generating a sheet beam of electrons, a traveling wave electron beam deflection system spaced from said cathode and in alignment with said electron sheet beam for dividing said electron sheet beam into a plurality of separate electron beams and for selectively aligning said separate electron beams with the analog to digital signal conversion device, a traveling wave analog deflection system spaced from said time deflection system and in alignment with said separate electron beams for sweeping said beams through angles that are related to the analog signal, a target plate having a plurality of apertures formed therein, said apertures being aligned in columns, each of said columns being individual to a respective one of said separate electron beams, said columns and apertures corresponding to the digital code, and an electron beam semiconductor target array spaced from said target plate and in alignment with said target plate apertures to permit said target plate apertures to enable said separate electron beams to selectively pass through at least some of said target plate apertures in response to the analog signal and to impact on at least some of said electron beam semiconductors in said target array to produce a digital signal that corresponds to the analog signal.

2. The device according to claim 1 wherein said columns of apertures in said target plate further include at least two matrices of said columns of apertures, one of said matrices corresponding to the columns of apertures that reflect the lower order digits in the digital code and the other of said matrices corresponding to the columns of apertures that reflect the higher order digits in the digital code, and said traveling wave analog deflection system having a first traveling wave deflection system for selectively sweeping said separate electron beams that are individual to respective columns in said low order matrix through angles that are specific to said lower order digits in the code and a second traveling wave deflection system for selectively sweeping said separate electron beams that are individual to respective columns in said higher order digits in the code.

3. A device according to claim 2 wherein said first and second traveling wave deflection systems include respective meanderline electron beam deflection structures.

4. A device according to claim 2 further including bias switching means electrically coupled to said first traveling wave analog deflection system for said low order digital code matrix, said bias switching means comprising a cathode for said bias switching device for generating a beam of electrons, a traveling wave analog electron beam deflection system for said bias switching device spaced from said cathode and in alignment with said beam of electrons for sweeping said beam through angles that are related to signals applied to said deflection system, a bias switching device target plate having a plurality of apertures formed therein in a predetermined pattern spaced from said bias switching device deflection system, and a bias switching device electron beam semiconductor target array spaced from said bias switching device target plate and in alignment therewith to enable portions of said beam to selectively pass through at least some of said target plate apertures and to impact on at least one of said bias switching electron beam semiconductors in said target array to produce a switching signal.

5. A device according to claim 1 wherein said traveling wave electron beam deflection system includes a ground plane plate, a traveling wave deflection plate parallel to and spaced from said ground plane plate, a plurality of spaced electrically conducting plates interposed between said ground plane plate and said traveling wave deflection plate and in electrical contact with said ground plane plate, a plurality of spaced dielectric plates equidistantly interposed between said conducting plates and positioned between said ground plane plate and said traveling wave deflection plate in order to form a plurality of individual apertures for each of said separate electron beams, and traveling wave electron beam deflection structures formed on each of said dielectric plates.

6. A device according to claim 4 wherein said traveling wave electron beam deflection structures include meanderline electron beam deflection structures.

7. A device according to claim 1 further including a second target plate having a plurality of apertures formed therein, said second target plate and plate apertures being aligned with said target plate and target plate apertures and said electron beam semiconductor target array and interposed therebetween in order to demagnify said separate electron beams.

* * * * *